US006764792B1

(12) United States Patent
Fujikawa et al.

(10) Patent No.: US 6,764,792 B1
(45) Date of Patent: Jul. 20, 2004

(54) HALFTONE PHASE SHIFT PHOTOMASK AND BLANKS FOR HALFTONE PHASE SHIFT PHOTOMASK FOR PRODUCING IT

(75) Inventors: Junji Fujikawa, Tokyo (JP); Yoshinori Kinase, Tokyo (JP); Takafumi Okamura, Tokyo (JP); Hiroshi Mohri, Tokyo (JP); Toshifumi Yokoyama, Tokyo (JP); Haruo Kokubo, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/830,598

(22) PCT Filed: Sep. 6, 2000

(86) PCT No.: PCT/JP00/06038

§ 371 (c)(1),
(2), (4) Date: Apr. 27, 2001

(87) PCT Pub. No.: WO01/20400

PCT Pub. Date: Mar. 22, 2001

(30) Foreign Application Priority Data

Sep. 9, 1999 (JP) .......................................... 11-255746

(51) Int. Cl.$^7$ ................................................ G03F 9/00
(52) U.S. Cl. ........................................................ 430/5
(58) Field of Search ..................... 430/5, 322; 427/582; 428/203, 472, 696, 698

(56) References Cited

U.S. PATENT DOCUMENTS

| 5,482,799 | A | | 1/1996 | Isao et al. ...................... 430/5 |
|---|---|---|---|---|
| 5,538,816 | A | | 7/1996 | Hashimoto et al. ............. 430/5 |
| 5,576,123 | A | * | 11/1996 | Mohri et al. ................... 430/5 |
| 5,721,075 | A | | 2/1998 | Hashimoto et al. ............. 430/5 |
| 5,804,337 | A | * | 9/1998 | Mitsui .......................... 430/5 |
| 5,849,439 | A | * | 12/1998 | Mitsui .......................... 430/5 |
| 6,037,083 | A | * | 3/2000 | Mitsui .......................... 430/5 |
| 6,087,047 | A | * | 7/2000 | Mitsui et al. ................... 430/5 |
| 6,395,434 | B1 | * | 5/2002 | Nozawa et al. ................ 430/5 |

* cited by examiner

Primary Examiner—S. Rosasco
(74) Attorney, Agent, or Firm—Dellett & Walters

(57) ABSTRACT

The invention relates to a halftone phase shift photomask which is controlled with precision in terms of its transmittance at a wavelength applied to inspection, and measuring equipment, so that its quality can easily be assured even when its phase difference at an exposure wavelength is controlled at 180° C. with precision and its transmittance is set at 1 to 20% as desired at that wavelength. The halftone phase shift photomask (107) comprises on a transparent substrate (101) and a halftone phase shift film containing at least tantalum, oxygen, carbon and nitrogen, and has a multilayer structure comprising at least two or more different layers (102) and (103).

14 Claims, 8 Drawing Sheets

HALFTONE PHASE SHIFT PHOTOMASK AND BLANKS FOR HALFTONE PHASE SHIFT PHOTOMASK FOR PRODUCING IT

ART FIELD

The present invention relates generally to a photomask used for the fabrication of high-density integrated circuits such as LSIs and a photomask blank for the fabrication of the same, and more particularly to a halftone phase shift photomask that enables projected images of minute size to be obtained and a halftone phase shift photomask blank for the fabrication of this halftone phase shift photomask.

BACKGROUND ART

Semiconductor integrated circuits such as LSIs are fabricated by the repetition of a so-called lithography process using a photomask. Possible applications of such phase shift masks as set forth in JP-A 58-173744, JP-B 62-59296, etc. to the formation of microcircuits in particular have already been under investigation. Among others, the so-called halftone phase shift photomask such as one set forth in U.S. Pat. No. 4,890,309, etc. has attracted attention in view of expedited practical applications. For instance, as disclosed in JP-A's 05-2259 and 05-127361, some proposals have been made in respect of arrangements and materials improved in yields and reduced in costs for the purpose of practical applications.

Here a typical halftone phase shift photomask is briefly explained with reference to FIGS. 7 and 8. FIGS. 7(a) through 7(d) are illustrative of the principles of halftone phase shift lithography, and FIGS. 8(a) through 8(d) are illustrative of a conventional process. FIGS. 7(a) and 8(a) are each a sectional view of a photomask, FIGS. 7(b) and 8(b) are each illustrative of the amplitude of light on the photomask, FIGS. 7(c) and 8(c) are each illustrative of the amplitude of light on a wafer, and FIGS. 7(d) and 8(d) are each illustrative of the intensity of light on the wafer. Reference numerals 411 and 421 are each a transparent substrate, 422 a 100% light-blocking film, 412 a halftone phase shift film, and 413 and 423 are each incident light. By the term "halftone phase shift film" used herein is intended a film, in a single layer or multilayer form, having functions of substantially inverting the phase of transmitting exposure light with respect to the phase of exposure light passing through the air having the same optical length and attenuating the intensity of the light. According to the conventional process, the 100% light-blocking film 422 formed of chromium or the like is provided on the substrate 421 formed of quartz glass or the like, as shown in FIG. 8(a), thereby achieving a simple arrangement where a light transmitting portion of any desired pattern is formed. The light on the wafer has such a fan-shaped intensity distribution as shown in FIG. 8(d), resulting in poor resolution. With the halftone phase shift lithography, on the other hand, it is possible to achieve improvements in resolution, because the phase of light transmitting through the halftone phase shift mask 412 is substantially inverted with respect to the phase of light transmitting through its opening, so that the intensity of light at pattern boundaries on the wafer is reduced to zero as shown in FIG. 7(d) and, hence, such a fan-shaped intensity distribution is prevented.

Referring to the halftone phase shift photomask in general, the optimum phase difference is 180°, and the optimum transmittance is in the range of 1to 20% (100% for the opening) as determined depending on the pattern to be transferred, transfer conditions, etc. A halftone phase shift mask must be fabricated in such a way as to meet its optimum phase difference and transmittance. Any deviation from the optimum values leads to changes in the correct exposure, etc., ending up with dimensional accuracy drops, a limited tolerance to focus, etc. Thus, the refractive index, extinction coefficient, thickness accuracy and thickness stability of the single layer or multilayer forming the halftone phase shift film are of vital importance.

To ensure the effect of the halftone phase shift photomask, the phase difference and transmittance thereof at an exposure wavelength are of vital importance. To reduce the influences of multiple scattering, etc. between the photomask and lenses in the photolithography process, the reflectance of the mask at an exposure wavelength should preferably be kept low as is the case with conventional photomasks, and most preferably be 20% or less. Regarding the appearance quality, dimensional accuracy, position accuracy, etc. of the pattern formed on the photomask, too, the photomask is required to have similar various properties to those needed for conventional photomasks. To ensure these properties, the optical properties of the photomask, for instance, its transmittance and reflectance at wavelengths at which various inspection and measuring devices are used in the masking process are also of vital importance. To be more specific, the photomask should have a transmittance and reflectance of 50% or less at wavelengths of 488 nm or less.

In this connection, halftone phase shift photomasks may be fabricated by means of PVD or CVD processes. In most cases, however, they are fabricated by a reactive sputtering process wherein main materials are used in the form of targets. The refractive index, extinction coefficient, thickness accuracy and stability of the film are basically determined by the film-formation process. For etching the phase difference shift film at the step of patterning the: phase shift photomask, dry etching such as reactive ion etching is chiefly used. In the process of fabricating phase shift photomasks, washing is repeatedly carried out so as to improve their degree of cleanliness.

For instance, halftone phase shift films comprising any one of tantalum, an oxide of tantalum, a nitride of tantalum and a combined oxide and nitride of tantalum have been proposed as set forth in JP-A's 05-257264, 07-134396 and 07-281414.

In recent years, as the pattern to be formed becomes fine, it is required to make short the wavelength of exposure light used for lithography, and KrF excimer lasers of 248 nm wavelength are now put to practical use for patterns finer than the so-called 0.25 μm design rule. With expected further size reductions in view, ArF excimer lasers of 193 nm wavelength are under investigation. For halftone phase shift films used for halftone phase shift photomasks, too, the development of materials capable of achieving the optimum phase difference and transmittance for these wavelengths and having stable refractive indices and extinction coefficients are in great demand.

However, conventional halftone phase shift films comprising any one of tantalum, an oxide of tantalum, a nitride of tantalum and a combined oxide and nitride of tantalum, too, have several problems. For instance, a problem with films comprising tantalum or the oxide of tantalum is that when they have a thickness enough to have a phase difference of 180° C. at 248 nm wavelength, their transmittance decreases to 1% or less that deviates the range of 1 to 20% thought of as being the optimum transmittance range.

For instance, the thickness vs. 248 nm wavelength phase difference and transmittance relations of a tantalum nitride film formed on a synthetic guartz substrate by a reactive sputtering process using a pure tantalum target in a nitrogen atmosphere are shown in FIG. 9. As can be seen from FIG. 9, the phase difference increases in proportion to an increasing thickness and, at the same time, the transmittance becomes low.

The tantalum nitride film has a phase difference of 180° at a thickness of 113 nm, but fails to have the transmittance needed for a phase shift photomask, because its transmittance is 0.06% at that thickness.

Films comprising the oxide of tantalum or the combined oxide and nitride of tantalum may have a phase difference of 180° and a transmittance of 1 to 20% as desired, both at 248 nm wavelength. However, these films cannot be inspected with precision by an inspection device for ensuring the appearance quality of a mask or a measuring device because their transmittance exceeds 50% at an inspection wavelength.

For instance, the thickness vs. phase difference and transmittance relations of a tantalum oxide film formed on a synthetic quartz substrate by a reactive sputtering process using a pure tantalum target in a nitrogen atmosphere are shown in FIG. 10. As shown in FIG. 10, the tantalum oxide film may be used as a phase shift mask because its phase difference and transmittance are 180° and 13%, respectively, at 81 nm thickness and 248 nm wavelength. A spectral transmittance curve and a spectral reflectance curve for an 81 nm thick tantalum oxide film are shown in FIGS. 11 and 12, respectively. As can be seen from FIG. 11, a transmittance of 80% or greater is obtained at wavelengths of 300 nm or greater. As can be seen from FIG. 12, a reflectance of 29% is obtained at 248 nm wavelength; it is impossible to obtain any sufficiently low reflectance at the exposure wavelength.

On the other hand, various inspection and measuring devices are used in the masking process for the purpose of ensuring various property requirements for a photomask, for instance, its appearance quality, dimensional accuracy and position accuracy. These devices are now mainly used with light of 365 nm to 633 nm wavelengths to make an inspection and measurement through a contrast of light intensity between a light transmitting portion and a light blocking portion. For precise measurement, the light blocking portion, viz., the halftone phase shift film must have a low transmittance or a transmittance of at least 50% or less in the wavelength range of 365 nm to 488 nm.

From the foregoing, it is found that it is very difficult to inspect and measure the tantalum oxide film with precision to check whether or not it is acceptable as a halftone phase shift photomask, and so it is impossible to ensure the quality needed for a photomask.

When a tantalum oxide film is formed at such a thickness as to ensure a phase difference of 180° at 248 nm wavelength by using a specific tantalum to oxygen ratio or adding nitrogen thereto to obtain a composite oxide and nitride film, its transmittance may be controlled to some extent. However, when this film is provided in a single layer film, it is impossible to obtain a transmittance of 1% or greater at 248 nm wavelength and a transmittance of 50% or less at wavelengths of 365 nm to 488 nm.

When phase shift photomasks comprising the oxide of tantalum, the nitride of tantalum and the combined oxide and nitride of tantalum are patterned by dry etching, it is difficult to gain precise phase difference control because a transparent substrate such as a quartz substrate is etched simultaneously with the tantalum film by a fluorine-base gas used at the dry etching step, giving rise to a phase difference.

SUMMARY OF THE INVENTION

In view of such states of the prior art as mentioned above, an object of the present invention is to provide a halftone phase shift photomask which is controlled with precision in terms of its transmittance at a wavelength applied to inspection, and measuring equipment, so that its quality can easily be assured even when its phase difference at an exposure wavelength is controlled at 180° C. with precision and its transmittance is set at 1 to 20% as desired at that wavelength as well as a halftone phase shift photomask blank for the fabrication of the same.

According to the present invention, the aforesaid object is achievable by the provision of a halftone phase shift photomask comprising on a transparent substrate and a halftone phase shift film containing at least tantalum, oxygen, carbon and nitrogen, characterized in that the halftone phase shift photomask has a multilayer structure comprising at least two or more different layers.

Each layer is formed of a film wherein the composition ratio of tantalum atoms and oxygen atoms is such that at least 100 oxygen atoms are contained per 100 tantalum atoms, a film wherein the composition ratio of tantalum atoms and other atoms is such that 100 or less other atoms are contained per 100 tantalum atoms or a film wherein the composition ratio of tantalum atoms and oxygen and nitrogen atoms is such that 50 to 250 oxygen atoms and 1 to 200 nitrogen atoms are contained per 100 tantalum atoms. Two or more such films are laminated one upon another while the thickness of each film is controlled, so that the photomask can have a phase difference of 180° and a transmittance of 1 to 13% as desired, both at 248 nm wavelength and a transmittance of 50% or less at a wavelength of 488 nm or less.

Preferably in this case, the multilayer film comprising two or more difference film should include at least one layer in which 100 or less other atoms are contained per 100 tantalum atoms.

The halftone phase shift photomask of the invention has a structure wherein a film with the composition ratio of tantalum atoms and oxygen atoms being such that at least 100 oxygen atoms are contained per 100 tantalum atoms is laminated on a film with the composition ratio of tantalum atoms and other atoms being such that 100 or less other atoms are contained per 100 tantalum atoms, or a structure wherein a film with the composition ratio of tantalum atoms and oxygen and nitrogen atoms being such that 50 to 250 oxygen atoms and 1 to 200 nitrogen atoms are contained per 100 tantalum atoms is laminated on a film with the composition ratio of tantalum atoms and other atoms being such that 100 or less other atoms are contained per 100 tantalum atoms. Thus, the halftone phase shift photomask can have a phase difference of 180° and a transmittance of 1 to 20% as desired, both at 248 nm wavelength, a transmittance of 50% or less at a wavelength of 488 nm or less and a reflectance of 20% or less at 248 nm wavelength.

The halftone phase shift photomask of the invention has a structure wherein a film with the composition ratio of tantalum atoms and other atoms being such that 100 or less other atoms are contained per 100 tantalum atoms is directly laminated on the transparent substrate, with subsequent films laminated successively thereon. The film with the composition ratio of tantalum atoms and other atoms being such that 100 or less other atoms are contained per 100 tantalum atoms can be etched with a chlorinous gas whereas the transparent substrate such as a synthetic quartz substrate is unsusceptible to etching with a chlorine-base etching gas.

Accordingly, when the phase shift film is dry etched, the film formed on the transparent substrate such as a synthetic quartz substrate, with the composition ratio of tantalum atoms and other atoms being such that 100 or less other atoms are contained per 100 tantalum atoms, can be etched using a chlorine-base gas. Thus, the phase shift film can be patterned while the transparent substrate such as a synthetic quartz substrate remains unetched, so that no phase difference occurs at that portion, resulting in precise phase difference control.

The halftone phase shift photomask of the invention has a structure wherein an etching stopper layer is formed on the transparent substrate, with halftone phase shift films laminated successively thereon. Accordingly, even when the phase shift film is patterned by dry etching using a chlorine or fluorine-base gas, the transparent substrate such as a synthetic quartz substrate remains unetched, so that no phase difference occurs at that portion, resulting in precise phase difference control.

Preferably in this case, the etching stopper layer should be formed of a material such as hafnium oxide, which has sufficient etching resistance and whose transmittance at 248 nm wavelength does not drop even when provided on the transparent substrate with a thickness enough to function as a stopper, for instance, with a thickness of about 50 nm.

It is here understood that the present invention also encompasses a halftone phase shift photomask blank for the fabrication of the aforesaid halftone phase shift photomask.

The advantages of the present invention are now explained. The present invention provides a halftone phase shift photomask and halftone phase shift photomask blank comprising on a transparent substrate a halftone phase shift film containing at least tantalum, oxygen, carbon and nitrogen, characterized by having a multilayer structure comprising two or more different films. By thickness control of each film, the halftone phase shift photomask is allowed to have a phase difference of 180° and a transmittance of 1 to 20% as desired, both at 248 nm wavelength, so that improved resolution can be obtained at a lithography step. Having a transmittance of 50% or less at a wavelength of 488 nm or less, this halftone phase shift photomask can also be inspected with precision by means of inspection, and measuring equipment for insuring its appearance quality.

The halftone phase shift photomask, or the blank therefor, of the invention has a structure wherein a film with the composition ratio of tantalum atoms and oxygen atoms being such that at least 100 oxygen atoms are contained per 100 tantalum atoms is laminated on a film with the composition ratio of tantalum atoms and other atoms being; such that 100 or less other atoms are contained per 100 tantalum atoms, or a structure wherein a film with the composition ratio of tantalum atoms and oxygen and nitrogen atoms being such that 50 to 250 oxygen atoms and 1 to 200 nitrogen atoms are contained per 100 tantalum atoms is laminated on a film with the composition ratio of tantalum atoms and other atoms being such that 100 or less other atoms are contained per 100 tantalum atoms. Thus, the halftone phase shift photomask can have a phase difference of 180° and a transmittance of 1 to 20% as desired, both at 248 nm wavelength, a transmittance of 50% or less at a wavelength of 488 nm or less and a reflectance of 20% or less at 248 nm wavelength. For this reason, multiple scattering, etc. can be prevented from occurring between the phase shift photomask and stepper lenses at an exposure wavelength in the lithography step, so that more improved resolution can be obtained.

The halftone phase shift photomask, or the blank therefor, of the present invention has a structure wherein a film with the composition ratio of tantalum atoms and other atoms being such that 100 or less other atoms are contained per 100 tantalum atoms is directly laminated on the transparent substrate, with subsequent films laminated successively thereon, or a structure wherein an etching stopper layer is formed on the transparent substrate, with halftone phase shift films laminated successively thereon. This enables only the halftone film to be selectively etched, so that there is no phase difference error which may otherwise result from etching of the transparent substrate such as a synthetic quartz substrate. It is thus possible to provide a phase shift photomask controlled with high precision in terms of phase difference.

BEST MODE FOR CARRYING OUT THE INVENTION

The halftone phase shift photomask and halftone phase shift photomask blank according to the present invention are now explained specifically with reference to their examples.

EXAMPLE 1

Figure 1A:
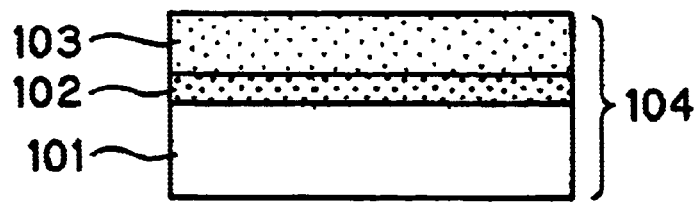
FIGS. 1(a) through 1(d) are illustrative of steps of fabricating a halftone phase shift mask blank according to Example 1 of the invention, and steps of processing the blank to obtain a halftone phase shift photomask.

Example 1 of the halftone phase shift photomask blank and halftone phase shift photomask according to the present invention are explained with reference to FIGS. 1(a) through 1(d). As shown in FIG. 1(a), the following two layers were successively formed on an optically polished, well-washed synthetic quartz substrate 101 by sputtering under the following conditions, the first layer comprising a film 102 composed mainly of tantalum and the second layer comprising a film 103 composed mainly of tantalum and oxygen. In this way, a halftone phase shift photomask blank 104 of a double-layer structure was obtained.

Conditions for the First Layer
    Sputtering system: DC magnetron sputtering system
    Target: Metallic tantalum
    Gas and flow rate: Argon gas 60 sccm
    Sputtering pressure: 15.0 millitorr
    Sputtering power: 0.8 kilowatts
Conditions for the Second Layer
    Sputtering system: DC magnetron sputtering system
    Target: Metallic tantalum
    Gases and flow rates: Argon gas 60 sccm plus carbonic acid gas 40 sccm
    Sputtering pressure: 5.0 millitorr
    Sputtering power: 1 kilowatt Here the formed first layer had a thickness of 15 nm and the second layer had a thickness of 62 nm.

Figure 4:
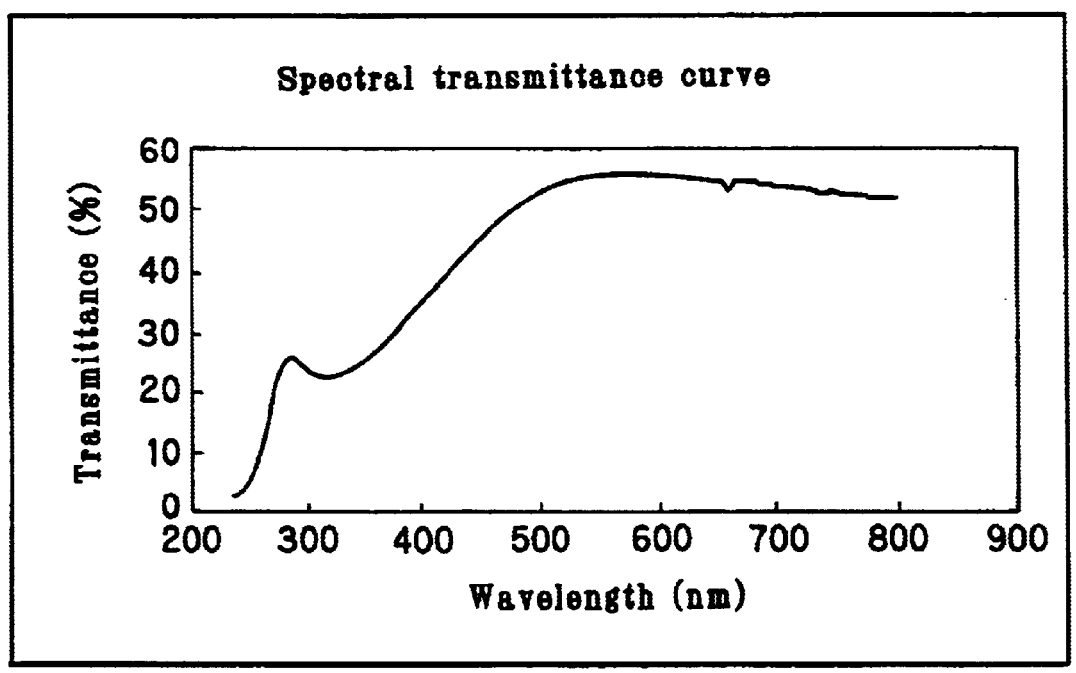
FIG. 4 is a spectral transmittance curve for the halftone phase shift photomask of Example 1.

By measurement on a commercially available transmittance meter (MCPD2000, Otsuka Denshi Ltd.), the phase shift film obtained under the aforesaid conditions was found to have a transmittance of 6.02% at 248 nm wavelength and a transmittance of 50% or less at a wavelength of 488 nm or less. A spectral transmittance curve for this phase shift film is shown in FIG. 4.

By x-ray photoelectron spectroscopy of the phase shift film obtained under the aforesaid conditions, the first layer was found to contain 16 oxygen atoms per 100 tantalum atoms and the second layer was found to contain 150 oxygen atoms per 100 tantalum atoms. For this X-ray photoelectron spectroscopy, ESCALAB210 (VG SCIENTIFIC) was used to analyze each layer after Ar ion beam etching.

Figure 1B:
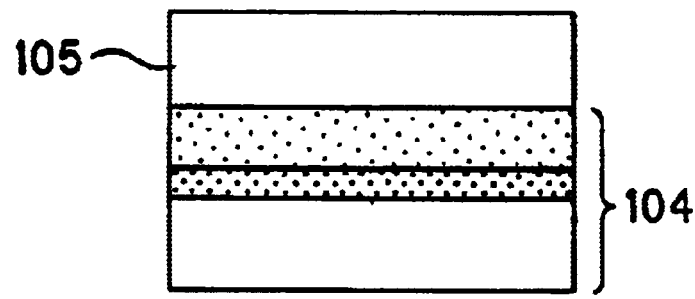

Next, the step of patterning and processing this halftone phase shift photomask blank 104 into a photomask is now explained. As shown in FIG. 1(b), a commercially available electron beam resist (ZEP7000, Nippon Zeon Co., Ltd.) is coated on the halftone phase shift photomask blank 104 at a post-baking thickness of 300 nm, and subsequently baked at 110° C. for 20 minutes to obtain an electron beam resist film 105.

Figure 1C:
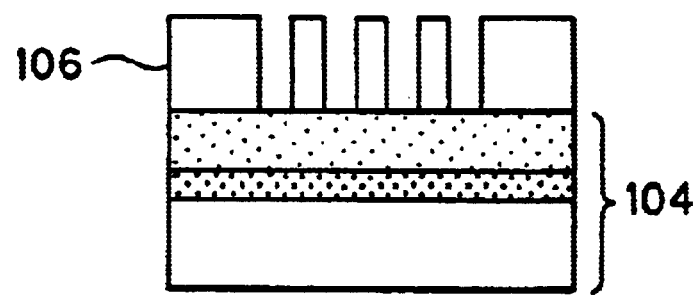
Figure 1D:
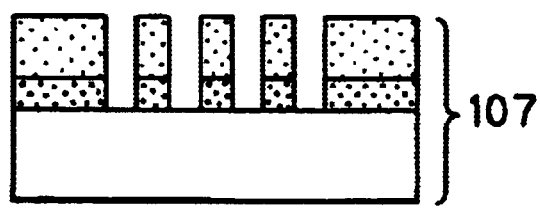

Then, a photomask electron beam lithography system is used to obtain a latent image in the desired pattern. Finally, this latent image is developed with a dedicated developing solution ZED500 to obtain such a desired resist pattern 106 as shown in FIG. 1(c). Using this resist pattern 106 as a mask, inductive coupled plasma etching is carried out under the following conditions for the dry etching of halftone phase shift film.
    Etching system: Inductive coupled plasma etcher
    Gases and flow rates: Sulfur hexafluoride gas 18 sccm plus oxygen gas 4 sccm
    Etching pressure: 10 millitorr
    Etching power: 250 watts
    Bias power: 10 watts After completion of etching, the halftone phase shift film is surface treated with ozone while irradiated with ultraviolet radiation to remove an unnecessary portion of the resist, thereby obtaining such a halftone phase shift photomask 107 as shown in FIG. 1(d). By measurement using a commercially available phase difference meter for phase shift masks (MPM248, Laser Tech Co., Ltd.), this halftone phase shift photomask was found to have a phase difference of 179.8° at 248 nm wavelength.

In the thus obtained phase shift photomask, the phase difference at 248 nm wavelength was controlled with precision in the vicinity of 180° and the transmittance at 488 nm wavelength was 50% or less, so that this photomask could be inspected with the highest sensitivity using an appearance inspection device and a measuring device. This example was carried out for the purpose of obtaining a halftone phase shift photomask having a most general transmittance of 6% at 248 nm wavelength. It is understood, however, that any phase shift photomask having a phase difference of 180° at the desired transmittance can easily be obtained by changing the thickness of the first and second layers.

In this example, etching was carried out using an inductive coupled plasma etcher in the process of forming the phase shift photomask blank into the photomask. If the upper or second layer 103 is first etched under the same conditions as mentioned above and the lower or first layer 102 composed mainly of tantalum is then etched using a chlorine-base gas, it is then possible to gain phase difference control with even higher precision because the transparent substrate 101 such as a synthetic quartz substrate remains unetched. Set out below are specific etching conditions.
    Etching system: Inductive coupled plasma etcher
    Gas and flow rate: Chlorine gas 21 sccm
    Etching pressure: 5 millitorr
    Etching power: 250 watts
    Bias power: 25 watts

EXAMPLE 2

Figure 2A:
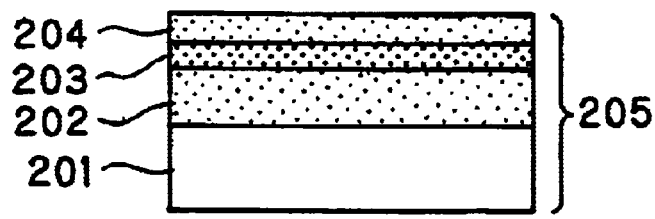
FIGS. 2(a) and 2(b) are illustrative of steps of fabricating a halftone phase shift photomask according to Example 2 of the invention.

Example 2 of the halftone phase shift photomask blank and halftone phase shift photomask according to the present invention are explained with reference to FIGS. 2(a) and 2(b). As shown in FIG. 2(a), the following three layers were successively formed on an optically polished, well-washed synthetic quartz substrate 201 by sputtering under the following conditions, the first layer comprising a film 202 composed mainly of tantalum and oxygen, the second layer comprising a film 203 composed mainly of tantalum, and the third layer comprising a film 204 composed mainly of tantalum and oxygen. In this way, a halftone phase shift photomask blank 205 of a triple-layer structure was obtained.

Conditions for the First Layer
    Sputtering system: DC magnetron sputtering system
    Target: Metallic tantalum
    Gases and flow rates: Argon gas 10 sccm plus carbonic acid gas 40 sccm
    Sputtering pressure: 5.0 millitorr
    Sputtering power: 1.0 kilowatt
Conditions for the Second Layer
    Sputtering system: DC magnetron sputtering system
    Target: Metallic tantalum
    Gas and flow rate: Argon gas 60 sccm
    Sputtering pressure: 15.0 millitorr
    Sputtering power: 0.8 kilowatts
Conditions for the Third Layer
    Sputtering system: DC magnetron sputtering system
    Target: Metallic tantalum
    Gases and flow rates: Argon gas 10 sccm plus carbonic acid gas 40 sccm
    Sputtering pressure: 5.0 millitorr
    Sputtering power: 1.0 kilowatt Here the formed first layer had a thickness of 50 nm, the second layer had a thickness of 15 nm and the third layer had a thickness of 12 nm.

Figure 5:
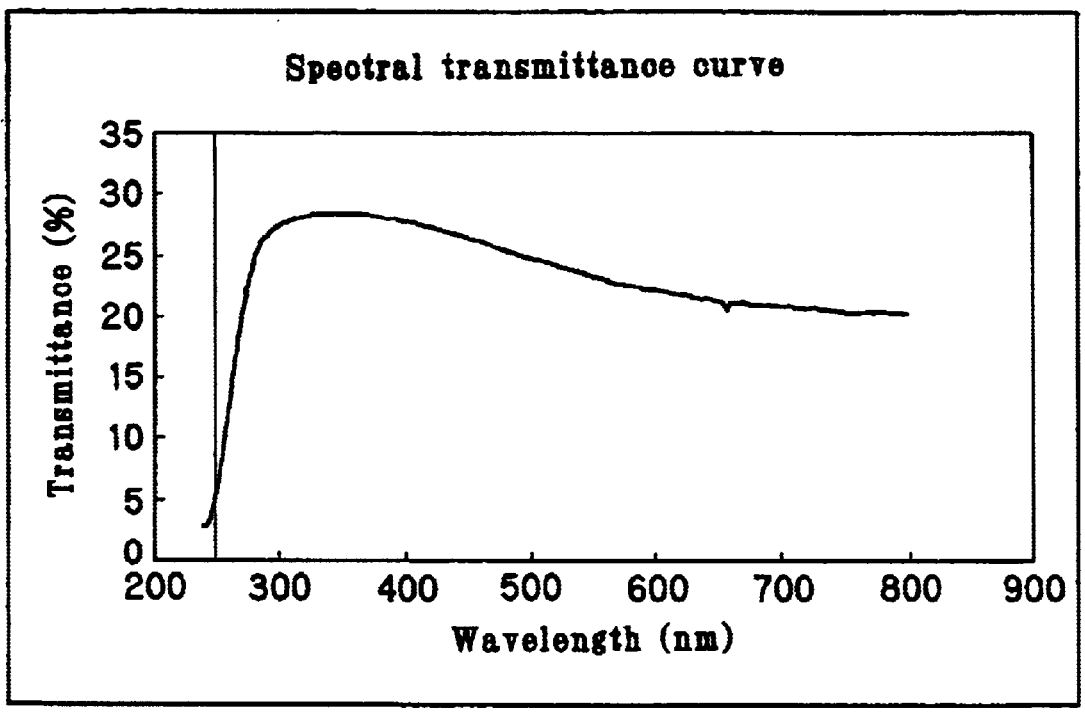
FIG. 5 is a spectral transmittance curve for the halftone phase shift photomask of Example 2.
Figure 6:
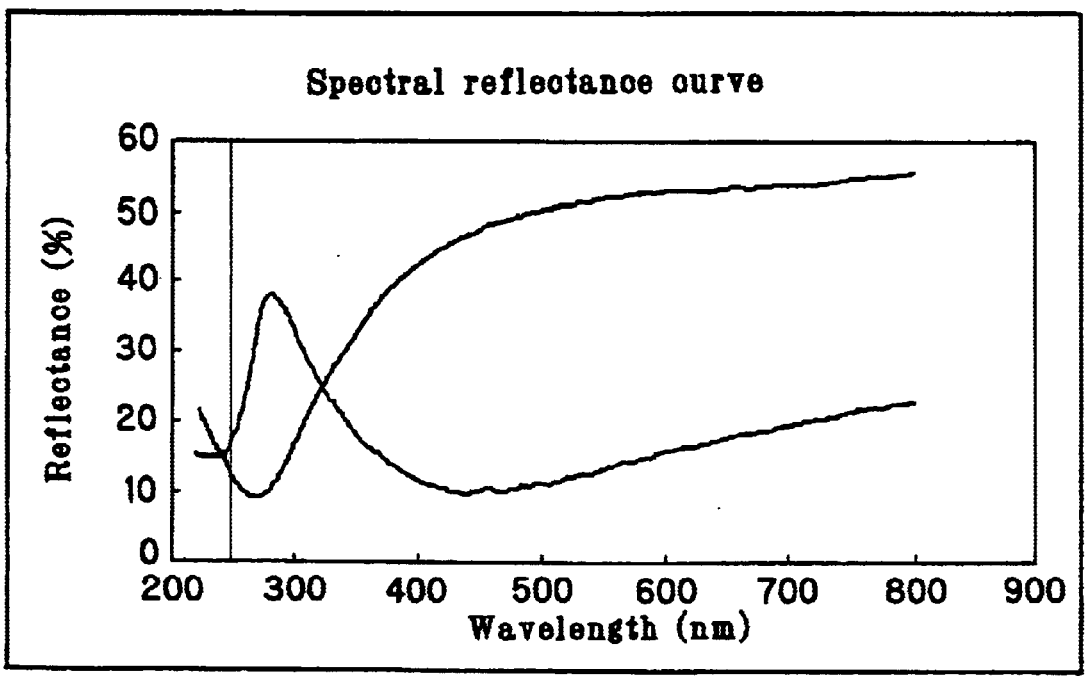
FIG. 6 is a spectral transmittance curve for the halftone phase shift photomask of Example 3.
Figure 7A:
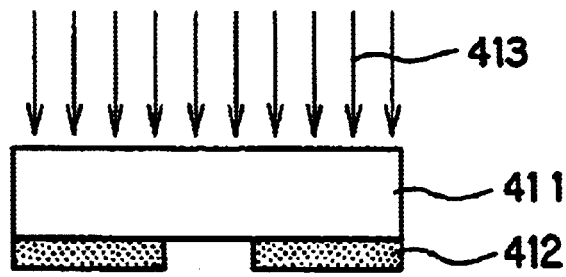
FIGS. 7(a) through 7(d) are illustrative of the principles of halftone phase shift lithography.
Figure 7B:
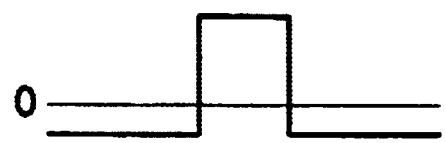
Figure 7C:
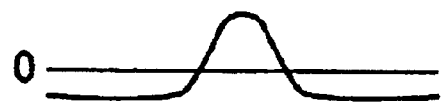
Figure 7D:
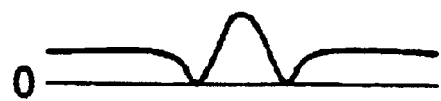
Figure 8A:
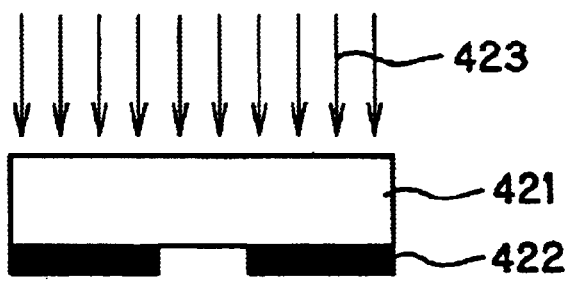
FIGS. 8(a) through 8(d) are illustrative of conventional lithography as compared with FIGS. 7(a) through 7(d).
Figure 8B:
Figure 8C:
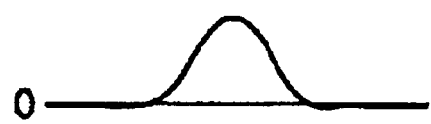
Figure 8D:
Figure 9:
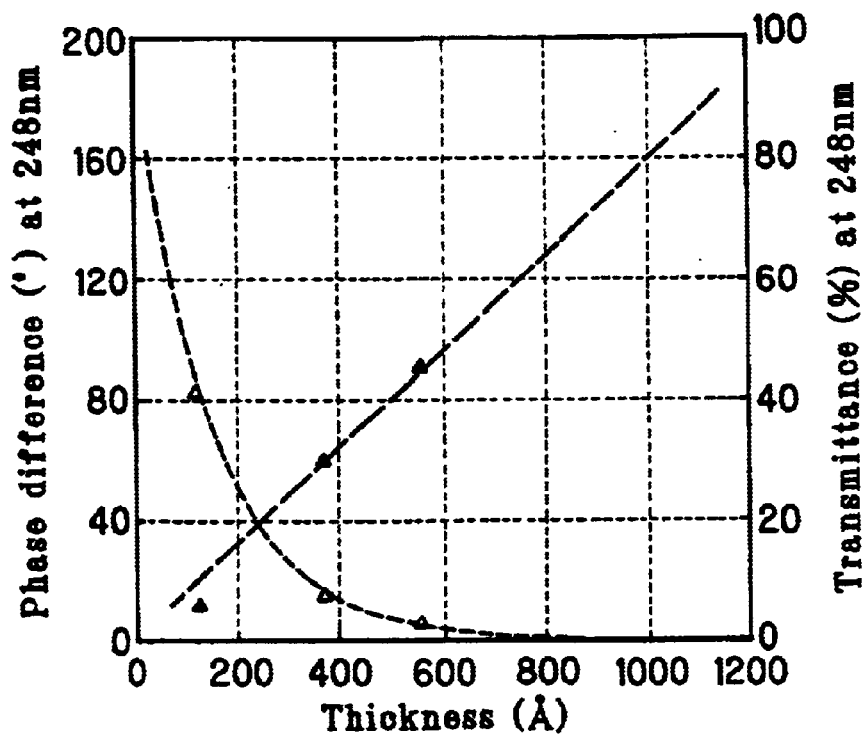
FIG. 9 is a graph illustrative of the thickness vs. phase difference/transmittance relations for a tantalum nitride film.
Figure 10:
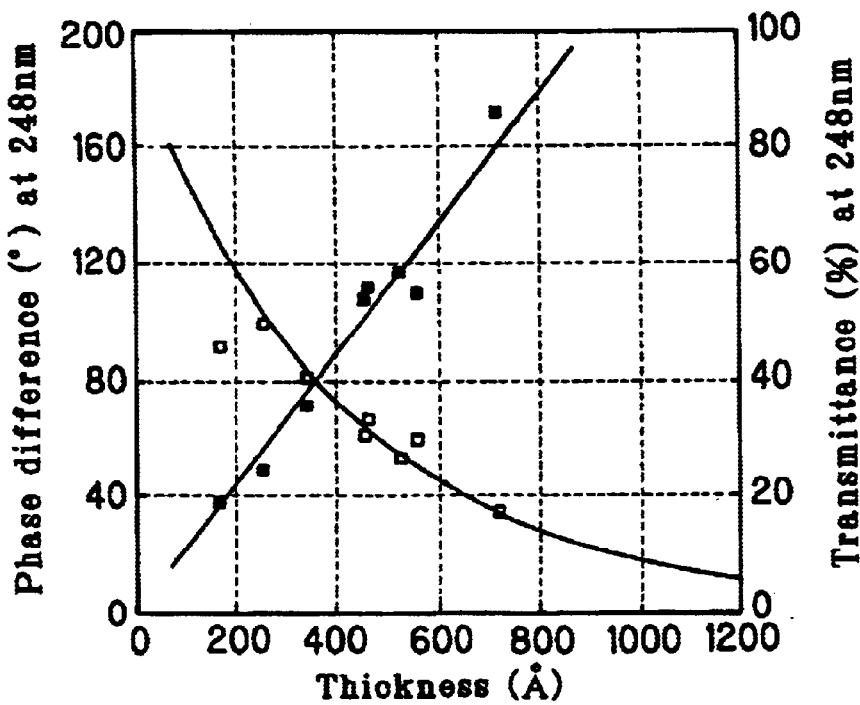
FIG. 10 is a graph illustrative of the thickness vs. phase difference/transmittance relations for a tantalum oxide film.
Figure 11:
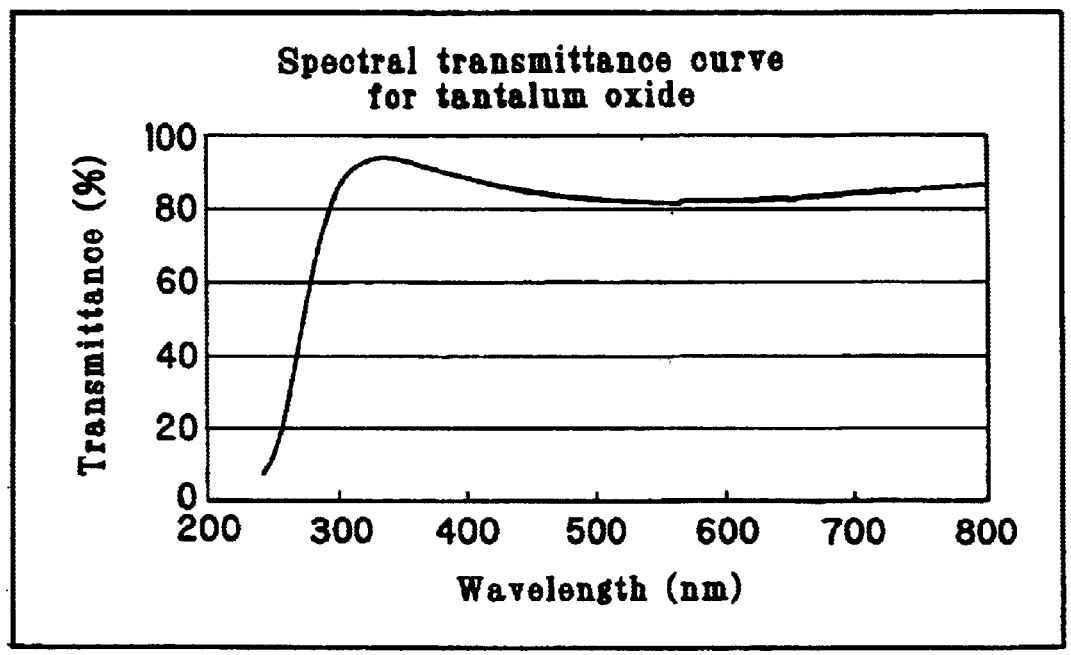
FIG. 11 is a spectral transmittance curve for an 81 nm thick tantalum oxide film.
Figure 12:
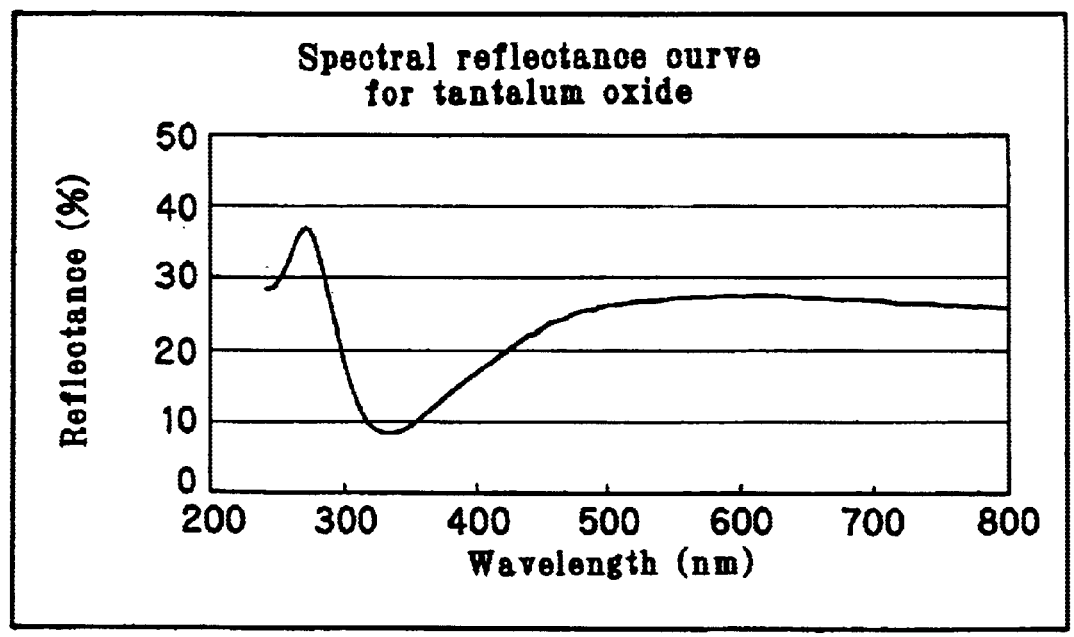
FIG. 12 is a spectral reflectance curve for an 81 nm thick tantalum oxide film.

By measurement on a commercially available transmittance meter (MCPD2000, Otsuka Denshi Ltd.), the phase shift film obtained under the aforesaid conditions was found to have a transmittance of 6.00% at 248 nm wavelength and a transmittance of 50% or less at a wavelength of 488 nm or less. A spectral transmittance curve for this phase shift film is shown in FIG. 5. By measurement on a commercially available reflectance meter (Automatic Spectral Luminosity Meter 330, Hitachi Ltd.), the phase shift film was found to be a low reflectance film as can be seen from a surface reflectance of 14.8% at 248 nm wavelength. A spectral reflectance curve for this phase shift film is shown in FIG. 6.

Figure 2B:
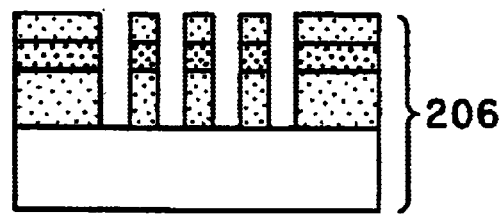

The step of processing this halftone phase shift photomask blank 205 into a halftone phase shift photomask 206 shown in FIG. 2(b) is the same as in Example 1. By measurement using a commercially available phase difference meter for phase shift masks (MPM248, Laser Tech Co., Ltd.), this halftone phase shift photomask 206 was found to have a phase difference of 180.1° at 248 nm wavelength.

In the thus obtained phase shift photomask, the phase difference at 248 nm wavelength was precisely controlled in the vicinity of 180° C. and the transmittance at 488 nm wavelength was 50% or less, so that this photomask could be inspected with the highest sensitivity using an appearance inspection device and a measuring device, as in Example 1. This example was carried out for the purpose of obtaining a halftone phase shift photomask having a most general transmittance of 6% at 248 nm wavelength. It is understood, however, that any phase shift photomask having a phase difference of 180° at the desired transmittance can easily be obtained by changing the thickness of the first and second layers, or the third layer, as in Example 1. It is also understood that the halftone phase shift photomask has a reflectance of as low as 14.8% at 248 nm wavelength, so that even higher resolution can be obtained in the photolithography process.

Even when instead of the film composed mainly of tantalum and oxygen, a film composed mainly of tantalum, oxygen and nitrogen is used for the third layer, similar advantages are obtainable. Set out are one exemplary film-formation conditions.

Conditions for the Third Layer

Sputtering system: DC magnetron sputtering system

Target: Metallic tantalum

Gases and flow rates: Argon gas 10 sccm plus carbonic acid gas 40 sccm plus nitrogen gas 30 sccm Sputtering pressure: 5.0 millitorr Sputtering power: 1.0 kilowatt Here a metallic tantalum film was formed on a synthetic quartz substrate at a thickness of 150 nm, and a film comprising tantalum, oxygen and nitrogen was formed thereon at a thickness of 28 nm under the aforesaid conditions. X-ray photoelectron spectroscopy showed that 136 oxygen atoms and 17 nitrogen atoms are contained per 100 tantalum atoms. For this X-ray photoelectron spectroscopy, ESCALAB210 (VG SCIENTIFIC) was used to analyze each layer after Ar ion beam etching.

EXAMPLE 3

Figure 3A:
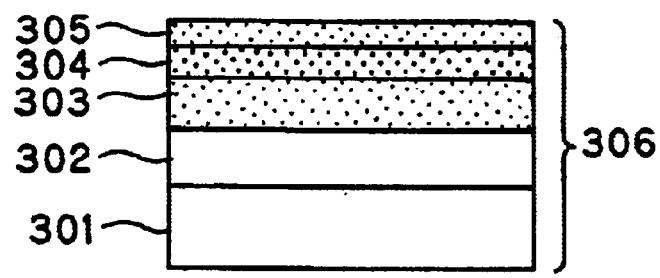
FIGS. 3(a) and 3(b) are illustrative of steps of fabricating a halftone phase shift mask blank according to Example 3 of the invention.

Example 3 of the halftone phase shift photomask blank and halftone phase shift photomask according to the present invention are explained with reference to FIGS. 3(a) and 3(b). As shown in FIG. 3(a), the following four layers were successively formed on an optically polished, well-washed synthetic quartz substrate 301 by sputtering under the following conditions, the first layer comprising an etching stopper layer 302 composed mainly of hafnium oxide, the second layer comprising a film 303 composed mainly of tantalum and oxygen, the third layer comprising a film 304 composed mainly of tantalum, and the fourth layer comprising a film 305 composed mainly of tantalum and oxygen. In this way, a halftone phase shift photomask blank 306 of a four-layer structure was obtained.

Conditions for the First Layer

Sputtering system: DC magnetron sputtering system

Target: Metallic hafnium

Gases and flow rates: Argon gas 10 sccm plus carbonic acid gas 40 sccm

Sputtering pressure: 5.0 millitorr

Sputtering power: 1.0 kilowatt

Conditions for the Second Layer

Sputtering system: DC magnetron sputtering system

Target: Metallic tantalum

Gas and flow rate: Argon gas 10 sccm plus carbonic acid gas 40 sccm

Sputtering pressure: 5.0 millitorr

Sputtering power: 1.0 kilowatt

Conditions for the Third Layer

Sputtering system: DC magnetron sputtering system

Target: Metallic tantalum

Gas and flow rate: Argon gas 60 sccm

Sputtering pressure: 15.0 millitorr

Sputtering power: 0.8 kilowatts

Conditions for the Fourth Layer

Sputtering system: DC magnetron sputtering system

Target: Metallic tantalum

Gas and flow rate: Argon gas 10 sccm plus carbonic acid gas 40 sccm

Sputtering pressure: 5.0 millitorr

Sputtering power: 1.0 kilowatt

Here the formed first layer had a thickness of 50 nm, the second layer had a thickness of 50 nm, the third layer had a thickness of 15 nm, and the fourth layer had a thickness of 12 nm.

The phase shift film obtained under the aforesaid conditions had the same transmittance as in Example 2.

Figure 3B:
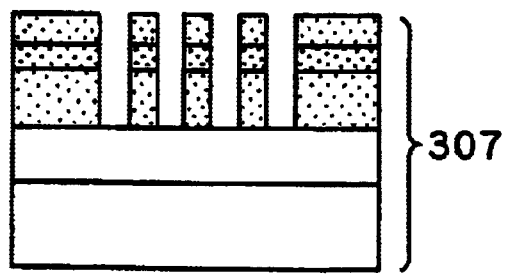

The step of processing this halftone phase shift photomask blank 306 into a halftone phase shift photomask 307 shown in FIG. 3(b) is the same as in Example 1. By measurement using a commercially available phase difference meter for phase shift masks (MPM248, Laser Tech Co., Ltd.), this halftone phase shift photomask 307 was found to have a phase difference of 180.1° at 248 nm wavelength.

In the thus obtained phase shift photomask, the phase difference at 248 nm wavelength was precisely controlled in the vicinity of 180° C. and the transmittance at 488 nm wavelength was 50% or less, so that this photomask could be inspected with the highest sensitivity using an appearance inspection device and a measuring device, as in Example 1. This example was carried out for the purpose of obtaining a halftone phase shift photomask having a most general transmittance of 6% at 248 nm wavelength. It is understood, however, that any phase shift photomask having a phase difference of 180° at the desired transmittance can easily be obtained by changing the thickness of the first and second layers, or the third layer, as in Example 1. It is also understood that the halftone phase shift photomask has a reflectance of as low as 14.8% at 248 nm wavelength, so that even higher resolution can be obtained in the photolithography process.

In this example, etching was carried out using an inductive coupled plasma etching system in the process of processing the phase shift photomask blank into a photomask. However, if this etching is finished while the aforesaid conditions are maintained all the time, it is then possible to gain more precise phase difference control, because the transparent substrate such as a quartz substrate remains unetched by virtue of the provision of the etching stopper layer thereon.

Possibility of Utilization in Industry

With the halftone phase shift photomask or the halftone phase shift photomask blank according to the invention, it is possible to obtain a transmittance of 1 to 13% at 248 nm wavelength and a transmittance of 50% or less in the wavelength range of 365 nm to 633 nm, as can be understood from the foregoing explanations, so that an inspection can easily be carried out so as to ensure the quality of photomasks. In addition, it is possible to achieve a reflectance of 20% or less at 248 nm wavelength and, hence, to obtain a halftone phase shift photomask of improved practical value, which is less susceptible to the influences of multiple scattering, etc. in the photolithography process. By the direct provision of an etching stopper layer on the transparent substrate, it is possible to fabricate a halftone phase shift photomask which is free from any phase difference caused by the etching of the transparent substrate and so is improved in phase precision.

What is claimed is:

1. A halftone phase shift photomask, comprising tantalum as a metal component on a transparent substrate, and containing oxygen, carbon and nitrogen, which photomask has a multilayer structure comprising at least two or more different layers, which includes at least one layer wherein the composition ratio of tantalum atoms and other atoms is such that 100 or less other atoms are contained per 100 tantalum atoms.

2. The halftone phase shift photomask according to claim 1, which has a structure wherein a film with the composition ratio of tantalum atoms and oxygen atoms being such that at least 100 oxygen atoms are contained per 100 tantalum atoms is laminated on a film with the composition ratio of tantalum atoms and other atoms being such that 100 or less other atoms are contained per 100 tantalum atoms.

3. The halftone phase shift photomask according to claim 1, which has a structure wherein a film with the composition ratio of tantalum atoms and oxygen and nitrogen atoms being such that 50 to 250 oxygen atoms and 1 to 200 nitrogen atoms are contained per 100 tantalum atoms is laminated on a film with the composition ratio of tantalum atoms and other atoms being such that 100 or less other atoms are contained per 100 tantalum atoms.

4. The halftone phase shift photomask according to claim 1, which has a structure wherein a film with the composition ratio of tantalum atoms and other atoms being such that 100 or less other atoms are contained per 100 tantalum atoms is directly formed on the transparent substrate, with subsequent films laminated successively thereon.

5. A halftone phase shift photomask comprising on a transparent substrate and a halftone phase shift film containing at least tantalum, oxygen, carbon and nitrogen, which photomask has a multilayer structure comprising at least two or more different layers, which includes at least one layer wherein the composition ratio of tantalum atoms and oxygen and nitrogen atoms is such that 50 to 175 oxygen atoms and 1 to 200 nitrogen atoms are contained per 100 tantalum atoms.

6. The halftone phase shift photomask according to any one of claims 1, and 5, to 2, 3, 4, which has a structure wherein an etching stopper layer is formed on the transparent substrate, with halftone phase shift films laminated successively thereon.

7. The halftone phase shift photomask according to claim 6, which has a structure wherein halftone phase shift films are successively laminated on the etching stopper layer formed of a film composed mainly of hafnium oxide.

8. A halftone phase shift photomask blank comprising on a transparent substrate a halftone phase shift film containing at least tantalum, oxygen, carbon and nitrogen, which has a multilayer structure comprising two or more different layers, which includes at least one layer wherein the composition ratio of tantalum atoms and oxygen and nitrogen atoms is such that 50 to 175 oxygen atoms and 1 to 200 nitrogen atoms are contained per 100 tantalum atoms.

9. A halftone phase shift photomask blank comprising on a transparent substrate a halftone phase shift film containing at least tantalum, oxygen, carbon and nitrogen, which has a multilayer structure comprising two or more different layers, which includes at least one layer wherein the composition ratio of tantalum atoms and other atoms is such that 100 or less other atoms are contained per 100 tantalum atoms.

10. The halftone phase shift photomask blank according to claim 9, which has a structure wherein a film with the composition ratio of tantalum atoms and oxygen atoms being such that at least 100 oxygen atoms are contained per 100 tantalum atoms is laminated on a film with the composition ratio of tantalum atoms and other atoms being such that 100 or less other atoms are contained per 100 tantalum atoms.

11. The halftone phase shift photomask blank according to claim 9, which has a structure wherein a film with the composition ratio of tantalum atoms and oxygen and nitrogen atoms being such that 50 to 250 oxygen atoms and 1 to 200 nitrogen atoms are contained per 100 tantalum atoms is laminated on a film with the composition ratio of tantalum atoms and other atoms being such that 100 or less other atoms are contained per 100 tantalum atoms.

12. The halftone phase shift photomask blank according to claim 9, which has a structure wherein a film with the composition ratio of tantalum atoms and other atoms being such that 100 or less other atoms are contained per 100 tantalum atoms is directly formed on the transparent substrate, with subsequent films laminated successively thereon.

13. The halftone phase shift photomask blank according to any one of claims 9, and 8, to 10, 11, 12, which has a structure wherein an etching stopper layer is formed on the transparent substrate, with halftone phase shift films laminated successively thereon.

14. The halftone phase shift photomask blank according to claim 13, which has a structure wherein halftone phase shift films are successively laminated on the etching stopper layer formed of a film composed mainly of hafnium oxide.

* * * * *